(12) United States Patent
Kato et al.

(10) Patent No.: US 6,707,704 B2
(45) Date of Patent: Mar. 16, 2004

(54) SEMICONDUCTOR MEMORY DEVICE AND DRIVE METHOD THEREFOR

(75) Inventors: Yoshihisa Kato, Shiga (JP); Yasuhiro Shimada, Kyoto (JP); Takayoshi Yamada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/392,843

(22) Filed: Mar. 21, 2003

(65) Prior Publication Data

US 2003/0185042 A1 Oct. 2, 2003

(30) Foreign Application Priority Data

Mar. 26, 2002 (JP) ........................................ 2002-085631

(51) Int. Cl.[7] .............................................. G11C 11/22
(52) U.S. Cl. ........................ 365/145; 365/63; 365/230.3
(58) Field of Search ............................. 365/145, 230.03, 365/51, 63

(56) References Cited

U.S. PATENT DOCUMENTS 6,151,242 A * 11/2000 Takashima ................... 365/145
6,297,986 B1 * 10/2001 Jae Kap ...................... 365/145
6,385,077 B1 * 5/2002 Kuo et al. .................... 365/145
6,519,203 B2 * 2/2003 Ashikaga .................. 365/230.01

FOREIGN PATENT DOCUMENTS

JP        2000-114491           4/2000

* cited by examiner

*Primary Examiner*—Vu A. Le
(74) *Attorney, Agent, or Firm*—McDermott, Will & Emery

(57) ABSTRACT

The semiconductor memory device of the invention includes at least three memory cell blocks arranged in a word line direction. Each of the memory cell blocks includes a plurality of memory cells arranged in a bit line direction. Each of the memory cells includes a ferroelectric capacitor for storing data by displacement of polarization of a ferroelectric film and a selection transistor connected to one of paired electrodes of the ferroelectric capacitor. Each of the memory cell blocks also includes: a bit line, a sub-bit line and a source line extending in the bit line direction; and a read transistor having a gate connected to one end of the sub-bit line, a source connected to the source line, and a drain connected to one end of the bit line. The read transistor reads data by detecting the displacement of the polarization of the ferroelectric film of the ferroelectric capacitor of a data read memory cell from which data is read among the plurality of memory cells. The sub-bit lines of any two of the memory cell blocks are connected to each other via a sub-bit line coupling switch.

12 Claims, 10 Drawing Sheets

US 6,707,704 B2

SEMICONDUCTOR MEMORY DEVICE AND DRIVE METHOD THEREFOR

BACKGROUND OF THE INVENTION

The present invention relates to a semiconductor memory device having memory cells arranged in a matrix, in which each of the memory cells includes a ferroelectric capacitor for storing binary data using displacement of polarization of a ferroelectric film and a selection transistor for selecting the ferroelectric capacitor for data read/write, and a drive method for such a semiconductor memory device.

A conventional semiconductor memory device having memory cells each including a ferroelectric capacitor and a selection transistor arranged in a matrix will be described with reference to FIG. 9.

FIG. 9 shows four memory cells MC00, MC01, MC10 and MC11, for example, arranged in a matrix of two rows and two columns. This conventional semiconductor memory device has a 2T2C structure, in which the memory cell MC00, for example, includes two ferroelectric capacitors C0 and C1 and two selection transistors Q0 and Q1. One of paired electrodes of each of the ferroelectric capacitors C0 and C1 is connected to the drain of the corresponding selection transistor Q0 or Q1.

Bit lines BL0 and XBL0 constitute a bit line pair, and bit lines BL1 and XBL1 constitute another bit line pair. The bit lines BL0 and XBL0 are connected to the sources of the corresponding selection transistors Q0 and Q1, respectively.

Word lines WL0 and WL1 are connected to the gates of the selection transistors of the memory cells arranged in the word line direction.

Cell plate lines CP0 and CP1 are connected to the other electrode of each of the ferroelectric capacitors of the memory cells arranged in the word line direction.

A sense amplifier SA0 is connected to the bit line pair BL0 and XBL0 and also connected to a pair of data bus lines DL0 and XDL0. A sense amplifier SA1 is connected to the bit line pair BL1 and XBL1 and also connected to a pair of data bus lines DL1 and XDL1.

Data write/read operation of the semiconductor memory device shown in FIG. 9 will be described. Assume that data is to be written in and read from the memory cell MC00, as an example.

Data write operation is achieved by writing complementary data in the two ferroelectric capacitors of the memory cell in which the data is to be written. A high voltage is applied to the word line WL0 to turn on the selection transistors Q0 and Q1, and then voltages of the opposite polarities are applied between the cell plate line CP0 and the bit line BL0 and between the cell plate line CP0 and the bit line XBL0. For example, when data "1" is to be written, a high signal is applied to the data bus line DL0 so that the ferroelectric capacitor C0 has downward polarization, and a low signal is applied to the data bus line XDL0 so that the ferroelectric capacitor C1 has upward polarization. When data "0" is to be written, a low signal is applied to the data bus line DL0 so that the ferroelectric capacitor C0 has upward polarization, and a high signal is applied to the data bus line XDL0 so that the ferroelectric capacitor C1 has downward polarization.

Data read operation is performed in the following manner.

First, the bit lines BL0, XBL0, BL1 and XBL1 are precharged to a low level. Thereafter, a high voltage is applied to the word line WL0 to turn on the selection transistors Q0 and Q1, and then a high voltage is applied to the cell plate line CP0. By this application, a minute voltage difference occurs between the bit line pair BL0 and XBL0, which is amplified by the sense amplifier SA0 and output to the data bus pair DL0 and XDL0.

The read operation described above uses the fact that the capacitance value of a ferroelectric capacitor changes with the polarization value previously stored in the ferroelectric capacitor. More specifically, in the case that downward polarization has been written in the ferroelectric capacitor in the data write process, charge is generated with reversal of the polarization when a voltage is applied to the cell plate line CP0, and this increases the capacitance value. On the contrary, in the case that upward polarization has been written in the ferroelectric capacitor, no reversal of polarization occurs when a voltage is applied to the cell plate line CP0, and this decreases the capacitance value.

The bit line voltage during the read operation is determined by capacitance splitting between the capacitance of the bit line and the capacitance of the ferroelectric capacitor. Therefore, the bit line voltage is high when the ferroelectric capacitor has downward polarization, and it is low when the ferroelectric capacitor has upward polarization. When a high voltage is output from the data bus line DL0 and a low voltage is output from the data bus line XDL0 after amplification of the voltages of the bit line pair, this indicates that the ferroelectric capacitor C0 has downward polarization and the ferroelectric capacitor C1 has upward polarization. Therefore, It can be decided that the stored data is "1". Contrarily, when a low voltage is output from the data bus line DL0 and a high voltage is output from the data bus line XDL0, it can be decided that the stored data is "0".

In the conventional semiconductor memory device, when data is read from the ferroelectric capacitor, the polarization of the ferroelectric capacitor is reversed. In other words, the data is corrupted. It is therefore necessary to rewrite the data after the read operation. The data read operation is only completed by performing rewrite of the data after the output of the data to the data bus.

If the polarization of the ferroelectric film of the ferroelectric capacitor is repeatedly reversed, the ferroelectric film becomes fatigued and degraded, causing reduction in polarization value. Therefore, the life of the ferroelectric capacitor will end after about 10 billion times of polarization reversal.

In the conventional semiconductor memory device, polarization reversal is necessary during the data read operation, in addition to during the data write operation. Therefore, the number of times of data rewrite and the number of times of data read are limited to about 10 billion in total.

In view of the above problem, the inventors of the present invention proposed a semiconductor memory device that permits increase of the number of times of read, that is, a semiconductor memory device in which data is not corrupted after the data read operation.

The semiconductor memory device having the above feature will be described with reference to FIG. 10.

FIG. 10 shows two memory cell blocks MC0 and MC1, for example, arranged in the word line direction. Each of the memory cell blocks MC0 and MC1 has four memory cells, for example, arranged in the bit line direction. The four memory cells constituting the memory cell block MC0, for example, include ferroelectric capacitors C0, C1, C2 and C3 and selection transistors Q0, Q1, Q2 and Q3 respectively connected in series. The memory cell block MC0 has a block selection transistor Q4 connected to one of common nodes, and a write transistor Q5 and a read transistor Q6 connected to the other common node. The memory cell block MC1 has a block selection transistor XQ4 connected to one of common nodes, and a write transistor XQ5 and a read transistor XQ6 connected to the other common node.

The operation of writing/reading data in/from the semiconductor memory device having the configuration described above will be described. Assume that complementary data is to be written in and read from the ferroelectric capacitors C2 and XC2, as an example.

The data write operation is performed in the following manner.

A high signal is applied to a block selection line BS, a write transistor control line RE and a selected word line WL2, to turn on the block selection transistors Q4 and XQ4, the write transistors Q5 and XQ5 and the cell selection transistors Q2 and XQ2. Contrarily, a low signal is applied to non-selected word lines WL0, WL1 and WL3, to turn off the cell selection transistors Q0, XQ0, Q1, XQ1, Q3 and XQ3.

Thereafter, when data "1" is to be written, a high signal is applied to a set line SET, a low signal is applied to a set line XSET, a low signal is applied to a reset line RST, and a high signal is applied to a reset line XRST. When data "0" is to be written, a low signal is applied to the set line SET, a high signal is applied to the set line XSET, a high signal is applied to the reset line RST, and a low signal is applied to the reset line XRST.

By the signal application described above, a set line voltage is applied to one of the electrodes of the ferroelectric capacitor C2 (and XC2) while a reset line voltage is applied to the other electrode thereof. Accordingly, when data "1" is written, the ferroelectric capacitor C2 has rightward polarization, and the ferroelectric capacitor XC2 has leftward polarization. When data "0" is written, the ferroelectric capacitor C2 has leftward polarization, and the ferroelectric capacitor XC2 has rightward polarization.

Once the write operation is terminated, the set line SET and the reset line RST are set at a same potential. Thereafter, a low signal is applied to the block selection line BS, the write transistor control line RE and the selected word line WL2, to turn off the block selection transistors Q4 and XQ4, the write transistors Q5 and XQ5 and the cell selection transistors Q2 and XQ2. By this operation, the inter-electrode voltages of the ferroelectric capacitors C2 and XC2 become zero. The ferroelectric films of the ferroelectric capacitors C2 and XC2 retain their polarization state when the device is powered off in this state. This semiconductor memory device therefore serves as a nonvolatile device.

The data read operation is performed in the following manner.

A high signal is applied to the block selection line BS and the selected word line WL2, to turn on the block selection transistors Q4 and XQ4 and the cell selection transistors Q2 and XQ2. Contrarily, a low signal is applied to the non-selected word lines WL0, WL1 and WL3, to turn off the cell selection transistors Q0, XQ0, Q1, XQ1, Q3 and XQ3.

By the signal application described above, ones of the electrodes of the ferroelectric capacitors C2 and XC2 are connected to the set lines SET and XSET, respectively, while the other electrodes of the ferroelectric capacitors C2 and XC2 are connected to the gates of the read transistors Q6 and XQ6, respectively. Contrarily, the ferroelectric capacitors C0, XC0, C1, XC1, C3, XC3 are disconnected from the read transistors Q6 and XQ6.

In the state described above, when a read voltage is applied to the set lines SET and XSET, a voltage determined by capacitance splitting between the capacitance value of the ferroelectric capacitor C2 and the MOS capacitance value of the read transistor Q6 is applied to the gate of the read transistor Q6. Likewise, a voltage determined by capacitance splitting between the capacitance value of the ferroelectric capacitor XC2 and the MOS capacitance value of the transistor XQ6 is applied to the gate of the read transistor XQ6.

Since the direction of the polarization of the ferroelectric film is different between storage of data "1" and storage of data "0", the capacitance value is different between the ferroelectric capacitors C2 and XC2. Accordingly, the gate potentials of the read transistors Q6 and XQ6, which are determined by the capacitance splitting, are different from each other. The difference in gate potential between the read transistors Q6 and XQ6 causes a change in source-drain conductance. Therefore, by amplifying this conductance change as a minute potential difference between the bit lines BL0 and XBL0 and outputting the amplified change to the data bus lines DL0 and XDL0, the stored data can be read.

Once the data read operation is terminated, the set lines SET and XSET and the reset lines RST and XRST are set at the ground potential. Thereafter, a low signal is applied to the block selection line BS and the selected word line WL2, to turn off the block selection transistors Q4 and XQ4 and the cell selection transistors Q2 and XQ2. Also, a high signal is applied to the write transistor control line RE, to turn on the write transistors Q5 and XQ5.

During the read operation, the gate potentials of the read transistors Q6 and XQ6 as floating nodes float due to a leak current from the ferroelectric capacitors C2 and XC2 and the cell selection transistors Q2 and XQ2. The floating node potential is however reset at a RST potential by the operation performed after the data read.

The polarization will not be reversed between before and after the read operation by setting the read voltage applied to the set lines SET and XSET so that the voltage applied to the ferroelectric capacitors C2 and XC2 during the read operation does not exceed a resistive voltage of the ferroelectric film. This eliminates the necessity of rewrite operation, and thus the number of times of read can be increased.

The semiconductor memory device shown in FIG. 10 can read data without corrupting the data as described above. However, since the semiconductor memory device stores complementary data in memory cells that belong to two memory cell blocks, that is, adopts the 2T2C structure, it has the problem that the area of the memory cells is large.

SUMMARY OF THE INVENTION

An object of the present invention is providing a semiconductor memory device in which the area of memory cells is reduced.

The semiconductor memory device of the present invention includes at least three memory cell blocks arranged in a word line direction, each of the at least three memory cell blocks including a plurality of memory cells arranged in a bit line direction, each of the plurality of memory cells including a ferroelectric capacitor for storing data by displacement of polarization of a ferroelectric film and a selection transistor connected to one of paired electrodes of the ferroelectric capacitor, wherein each of the at least three memory cell blocks includes: a bit line, a sub-bit line and a source line extending in the bit line direction; and a read transistor having a gate connected to one end of the sub-bit line, a source connected to the source line, and a drain connected to one end of the bit line, the read transistor reads data by detecting the displacement of the polarization of the ferroelectric film of the ferroelectric capacitor of a data read memory cell from which data is read among the plurality of memory cells, and the sub-bit lines of two memory cell blocks among the at least three memory cell blocks are connected to each other via a sub-bit line coupling switch.

According to the semiconductor memory device of the present invention, the other ends of the sub-bit lines belonging to any two memory cell blocks among the at least three memory cell blocks are connected to each other via the sub-bit line coupling switch. Therefore, the memory cell blocks connected to each other via the sub-bit line coupling switch together function as a reference potential generator. By writing reference data "1" in a memory cell belonging to one of the two memory cell blocks and reference data "0" in a memory cell belonging to the other memory cell block, a reference voltage can be generated based on the reference data written in these two memory cells. By comparing the voltage between the paired electrodes of the ferroelectric capacitor of a memory cell belonging to a memory cell block different from the memory cell blocks used for generation of the reference voltage with the reference voltage, data stored in the ferroelectric capacitor of the memory cell can be read. In this way, memory cells each essentially composed of one ferroelectric capacitor and one selection transistor, that is, memory cells of a 1T1C structure are realized. The number of components constituting the 1T1C memory cell can be reduced compared with the 2T2C memory cell. Therefore, the area of the memory cells can be reduced.

In the semiconductor memory device of the invention, preferably, each of the at least three memory cell blocks includes a reset line extending in the bit line direction, and the sub-bit line is connected to the reset line via a reset switch.

By the arrangement described above, a desired voltage can be applied from the reset line to the sub-bit line. Therefore, the potential of the sub-bit line can be reset before and after data read operation.

If one end of the sub-bit line is not connected to the reset line via the reset switch, a write voltage must be applied from the well of the read transistor to the electrode of the ferroelectric capacitor via the gate capacitance, to write data in the ferroelectric capacitor. This requires a large write voltage.

According to the present invention, in which a desired voltage can be applied from the reset line to the sub-bit line, a write voltage can be applied from the reset line to the electrode of the ferroelectric capacitor. Therefore, the write voltage can be reduced.

When the semiconductor memory device of the invention includes a reset line, the reset line and the source line are preferably the same line.

By the arrangement described above, the area of the memory cell blocks can be reduced.

When the semiconductor memory device of the invention includes a reset line, two memory cell blocks adjacent in the word line direction among the at least three memory cell blocks preferably share the reset line.

By the arrangement described above, the area of the memory cell blocks can be reduced.

In the semiconductor memory cell of the invention, the other electrodes of the ferroelectric capacitors of memory cells arranged in the word line direction among the plurality of memory cells belonging to the at least three memory cell blocks preferably constitute a common electrode extending in the word line direction.

The above arrangement eliminates the necessity of placing an electrode isolating area between every adjacent memory cells, and thus the area of the memory cell blocks can be reduced.

The drive method for a semiconductor memory device of the present invention is a drive method for the semiconductor memory device described above. The method includes the steps of: writing reference data "1" in one of two memory cells adjacent to each other in the word line direction, while writing reference data "0" in the other memory cell, the two memory cells belonging to two memory cell blocks of which the sub-bit lines are connected to each other via the sub-bit line coupling switch among the at least three memory cell blocks; determining a reference voltage from a voltage between the paired electrodes of the ferroelectric capacitor of the memory cell in which the reference data "1" has been written and a voltage between the paired electrodes of the ferroelectric capacitor of the memory cell in which the reference data "0" has been written; and reading the data stored in the ferroelectric capacitor of the data read memory cell among the plurality of memory cells belonging to a memory cell block different from the two memory cell blocks among the at least three memory cell blocks by comparing a voltage between the paired electrodes of the ferroelectric capacitor of the data read memory cell with the reference voltage.

The reference data "0" and the reference data "1" may be written, not only in two memory cell blocks, but also in a number of memory cell blocks.

According to the drive method for a semiconductor memory device of the present invention, voltage change can be performed for the charge generated from the memory cell storing the reference data "0" and the memory cell storing the reference data "1" with capacitive loads of the sub-bit lines and the read transistors of the memory cell blocks to which these memory cells belong. In other words, the potential of the sub-bit lines to which the memory cells storing the reference data are connected is set at a median value between the sub-bit line potential generated based on data "1" and the sub-bit line potential generated data "0". This median value can be used as the reference voltage. By comparing the voltage between the paired electrodes of the reference capacitor of a memory cell belonging to a memory cell block to which no memory cell storing reference data belongs with the reference voltage, data stored in the reference capacitor can be read. In this way, a memory cell essentially composed of one ferroelectric capacitor and one selection transistor, that is, a memory cell of a 1T1C structure can be achieved. The number of components constituting the 1T1C memory cells can be reduced compared with the 2T2C memory cells. Therefore, the area of the memory cells can be reduced.

In particular, by storing reference data in a memory cell belonging to a memory cell block located near the memory cell block to which the memory cell storing data belongs, it is possible to reduce a variation in property caused by the positions of the ferroelectric capacitors on the substrate and a variation in property caused by the positions of the transistors on the substrate. Thus, stable operation of the 1T1C structure, which is conventionally difficult, can be achieved.

In the drive method of the invention, preferably, each of the at least three memory cell blocks includes a reset line extending in the bit line direction, and the sub-bit line is connected to the reset line via a reset switch, the step of reading the data includes the steps of: connecting one of the paired electrodes of the ferroelectric capacitor of the data read memory cell to the sub-bit line by turning on the selection transistor of the data read memory cell, connecting the sub-bit line to the reset line by turning on the reset switch, and in this state, applying a reset voltage to the reset line; disconnecting the sub-bit line from the reset line by turning off the reset switch; and reading the data by applying a read voltage to the other electrode of the ferroelectric capacitor of the data read memory cell in the state that the sub-bit line is disconnected from the reset line.

By the method described above, a read voltage can be applied after resetting of the potential of the sub-bit line to which the data read memory cell is connected. This enables stable read operation.

In the drive method of the invention, preferably, each of the at least three memory cell blocks includes a reset line extending in the bit line direction, and the sub-bit line is connected to the reset line via a reset switch, the drive method further includes, after the step of reading the data, the steps of: connecting one of the paired electrodes of the ferroelectric capacitor of the data read memory cell to the sub-bit line by turning on the selection transistor of the data read memory cell, connecting the sub-bit line to the reset line by turning on the reset switch, and in this state, applying a reset voltage to the reset line; and disconnecting the sub-bit line from the reset line by turning off the reset switch.

By the method described above, the potential of the sub-bit line to which the data read memory cell is connected can be reset after the data read from the data read memory cell. This prevents an occurrence that data may be destroyed due to an unwanted voltage remaining in the storage node, and thus enables stable data retention.

In drive method of the invention, preferably, the step of reading the data includes the steps of: reading the data by applying a read voltage to the other electrode of the ferroelectric capacitor of the data read memory cell; and removing the read voltage applied to the other electrode of the ferroelectric capacitor of the data read memory cell, wherein the read voltage is set at a level of value with which the direction of the polarization of the ferroelectric film of the ferroelectric capacitor of the data read memory cell resumes the original direction before the data is read when the read voltage is removed.

By the method described above, no rewrite operation is required after the data read. This increases the number of times by which data can be read.

In the drive method of the invention, preferably, the read voltage is set at a level of value greater than a detection limit of a comparator comparing the voltage between the paired electrodes of the ferroelectric capacitor of the data read memory cell with the reference voltage and smaller than a resistive electric field between the paired electrodes of the ferroelectric capacitor of the data read memory cell.

By the method described above, the read voltage can be reliably set at a level of value with which the displacement of the polarization of the ferroelectric film of the ferroelectric capacitor of the data read memory cell resumes the original displacement before the data read when the read voltage is removed.

In the drive method of the invention, preferably, each of the at least three memory cell blocks includes a reset line extending in the bit line direction, and the sub-bit line is connected to the reset line via a reset switch, the drive method further includes the step of: writing data in the ferroelectric capacitor of a data write memory cell among the plurality of memory cells belonging to the at least three memory cell blocks, the step of writing data includes the step of: connecting one of the paired electrodes of the ferroelectric capacitor of the data write memory cell to the sub-bit line by turning on the selection transistor of the data write memory cell, connecting the sub-bit line to the reset line by turning on the reset switch, and in this state, applying a write voltage corresponding to binary data between the other electrode of the ferroelectric capacitor of the data write memory cell and the reset line.

By the method described above, data can be written with a low write voltage.

In the drive method of the invention, preferably, the absolute of the write voltage when the binary data is data "0" is different from the absolute of the write voltage when the binary data is data "1".

By the method described above, the reliability of the semiconductor memory device can be improved.

DESCRIPTION OF THE PREFERRED EMBODIMENTS

Hereinafter, preferred embodiments of the present invention will be described with reference to the accompanying drawings.

Embodiment 1

A semiconductor memory device and a drive method for the same of Embodiment 1 will be described with reference to FIGS. 1 to 7.

Figure 1:
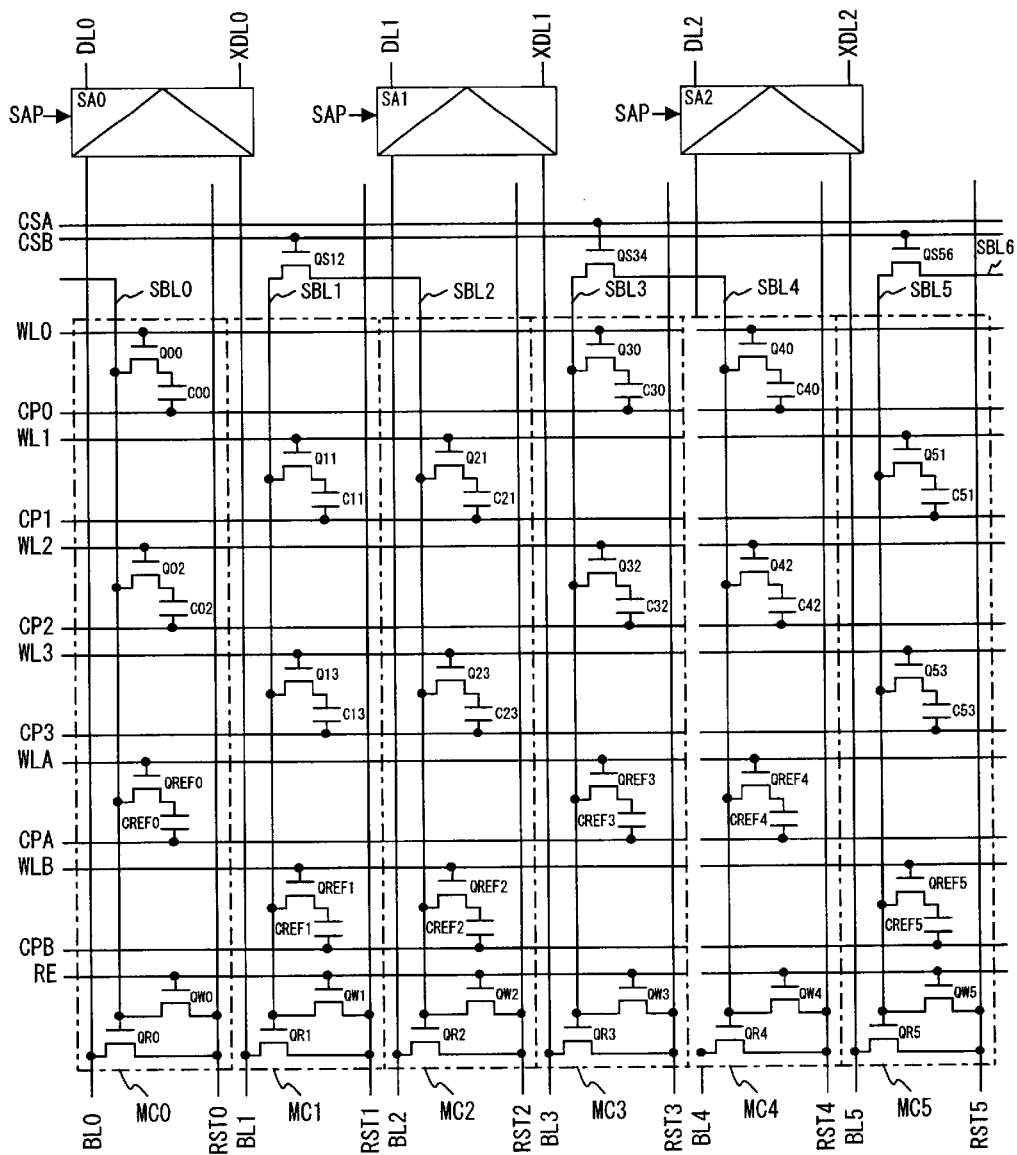
FIG. 1 is a circuit diagram of a semiconductor memory device of Embodiment 1 of the present invention.

Referring to FIG. 1, six memory cell blocks MC0, MC1, MC2, MC3, MC4 and MC5, for example, are arranged in the wide line direction. The first memory cell block MC0 includes a bit line BL0, a sub-bit line SBL0 and a reset line RST0 extending in the bit line direction. The second memory cell block MC1 includes a bit line BL1, a sub-bit line SBL1 and a reset line RST1 extending in the bit line direction. The third memory cell block MC2 includes a bit line BL2, a sub-bit line SBL2 and a reset line RST2 extending in the bit line direction. The fourth memory cell block MC3 includes a bit line BL3, a sub-bit line SBL3 and a reset line RST3 extending in the bit line direction. The fifth memory cell block MC4 includes a bit line BL4, a sub-bit line SBL4 and a reset line RST4 extending in the bit line direction. The sixth memory cell block MC5 includes a bit line BL5, a sub-bit line SBL5 and a reset line RST5 extending in the bit line direction.

The first memory cell block MC0 has a data storage memory cell including a ferroelectric capacitor C00 and a selection transistor Q00, a data storage memory cell including a ferroelectric capacitor C02 and a selection transistor Q02, a reference data storage memory cell including a ferroelectric capacitor CREF0 and a selection transistor QREF0, a write transistor QW0 and a read transistor QR0.

The selection transistor Q00 is serially connected between the sub-bit line SBL0 and one of the electrodes of the ferroelectric capacitor C00. The gate of the selection transistor Q00 is connected to a word line WL0. The other electrode of the ferroelectric capacitor C00 is integrated with a plate line CP0 used as a common electrode. The selection transistor Q02 is serially connected between the sub-bit line SBL0 and one of the electrodes of the ferroelectric capacitor C02. The gate of the selection transistor Q02 is connected to a word line WL2. The other electrode of the ferroelectric capacitor C02 is integrated with a plate line CP1 used as a common electrode. The selection transistor QREF0 is serially connected between the sub-bit line SBL0 and one of the electrodes of the ferroelectric capacitor CREF0. The gate of the selection transistor QREF0 is connected to a word line WLA. The other electrode of the ferroelectric capacitor CREF0 is integrated with a plate line CPA used as a common electrode.

The gate, source and drain of the write transistor QW0 are connected to a write transistor control line RE, an end of the reset line RST0, and an end of the sub-bit line SBL0, respectively. The gate, source and drain of the read transistor QR0 are connected to the end of the sub-bit line SBL0, the end of the reset line RST0 used as a source line, and an end of the bit line BL0, respectively.

The second memory cell block MC1 has a data storage memory cell including a ferroelectric capacitor C11 and a selection transistor Q11, a data storage memory cell including a ferroelectric capacitor C13 and a selection transistor Q13, a reference data storage memory cell including a ferroelectric capacitor CREF1 and a selection transistor QREF1, a write transistor QW1 and a read transistor QR1.

The selection transistor Q11 is serially connected between the sub-bit line SBL1 and one of the electrodes of the ferroelectric capacitor C11. The gate of the selection transistor Q11 is connected to a word line WL1. The other electrode of the ferroelectric capacitor C11 is integrated with a plate line CP1 used as a common electrode. The selection transistor Q13 is serially connected between the sub-bit line SBL1 and one of the electrodes of the ferroelectric capacitor C13. The gate of the selection transistor Q13 is connected to a word line WL3. The other electrode of the ferroelectric capacitor C13 is integrated with a plate line CP3 used as a common electrode. The selection transistor QREF1 is serially connected between the sub-bit line SBL1 and one of the electrodes of the ferroelectric capacitor CREF1. The gate of the selection transistor QREF1 is connected to a word line WLB. The other electrode of the ferroelectric capacitor CREF1 is integrated with a plate line CPB used as a common electrode.

The gate, source and drain of the write transistor QW1 are connected to the write transistor control line RE, an end of the reset line RST1, and an end of the sub-bit line SBL1, respectively. The gate, source and drain of the read transistor QR1 are connected to the end of the sub-bit line SBL1, the end of the reset line RST1 used as a source line, and an end of the bit line BL1, respectively.

The third memory cell block MC2 has a data storage memory cell including a ferroelectric capacitor C21 and a selection transistor Q21, a data storage memory cell including a ferroelectric capacitor C23 and a selection transistor Q23, a reference data storage memory cell including a ferroelectric capacitor CREF2 and a selection transistor QREF2, a write transistor QW2 and a read transistor QR2.

The selection transistor Q21 is serially connected between the sub-bit line SBL2 and one of the electrodes of the ferroelectric capacitor C21. The gate of the selection transistor Q21 is connected to the word line WL1. The other electrode of the ferroelectric capacitor C21 is integrated with the plate line CP1 used as a common electrode. The selection transistor Q23 is serially connected between the sub-bit line SBL2 and one of the electrodes of the ferroelectric capacitor C23. The gate of the selection transistor Q23 is connected to the word line WL3. The other electrode of the ferroelectric capacitor C23 is integrated with the plate line CP3 used as a common electrode. The selection transistor QREF2 is serially connected between the sub-bit line SBL2 and one of the electrodes of the ferroelectric capacitor CREF2. The gate of the selection transistor QREF2 is connected to the word line WLB. The other electrode of the ferroelectric capacitor CREF2 is integrated with the plate line CPB used as a common electrode.

The gate, source and drain of the write transistor QW2 are connected to the write transistor control line RE, an end of the reset line RST2, and an end of the sub-bit line SBL2, respectively. The gate, source and drain of the read transistor QR2 are connected to the end of the sub-bit line SBL2, the end of the reset line RST2 used as a source line, and an end of the bit line BL2, respectively.

The fourth memory cell block MC3 has a data storage memory cell including a ferroelectric capacitor C30 and a selection transistor Q30, a data storage memory cell including a ferroelectric capacitor C32 and a selection transistor Q32, a reference data storage memory cell including a ferroelectric capacitor CREF3 and a selection transistor QREF3, a write transistor QW3 and a read transistor QR3.

The selection transistor Q30 is serially connected between the sub-bit line SBL3 and one of the electrodes of the ferroelectric capacitor C30. The gate of the selection transistor Q30 is connected to the word line WL0. The other electrode of the ferroelectric capacitor C30 is integrated with the plate line CP0 used as a common electrode. The selection transistor Q32 is serially connected between the sub-bit line SBL3 and one of the electrodes of the ferroelectric capacitor C32. The gate of the selection transistor Q32 is connected to the word line WL2. The other electrode of the ferroelectric capacitor C32 is integrated with the plate line CP2 used as a common electrode. The selection transistor QREF3 is serially connected between the sub-bit line SBL3 and one of the electrodes of the ferroelectric capacitor CREF3. The gate of the selection transistor QREF3 is connected to the word line WLA. The other electrode of the ferroelectric capacitor CREF3 is integrated with the plate line CPA used as a common electrode.

The gate, source and drain of the write transistor QW3 are connected to the write transistor control line RE, an end of the reset line RST3, and an end of the sub-bit line SBL3, respectively. The gate, source and drain of the read transistor QR3 are connected to the end of the sub-bit line SBL3, the end of the reset line RST3 used as a source line, and an end of the bit line BL3, respectively.

The fifth memory cell block MC4 has a data storage memory cell including a ferroelectric capacitor C40 and a selection transistor Q40, a data storage memory cell including a ferroelectric capacitor C42 and a selection transistor Q42, a reference data storage memory cell including a ferroelectric capacitor CREF4 and a selection transistor QREF4, a write transistor QW4 and a read transistor QR4.

The selection transistor Q40 is serially connected between the sub-bit line SBL4 and one of the electrodes of the ferroelectric capacitor C40. The gate of the selection transistor Q40 is connected to the word line WL0. The other electrode of the ferroelectric capacitor C40 is integrated with the plate line CP0 used as a common electrode. The selection transistor Q42 is serially connected between the sub-bit line SBL4 and one of the electrodes of the ferroelectric capacitor C42. The gate of the selection transistor Q42 is connected to the word line WL2. The other electrode of the ferroelectric capacitor C42 is integrated with the plate line CP2 used as a common electrode. The selection transistor QREF4 is serially connected between the sub-bit line SBL4 and one of the electrodes of the ferroelectric capacitor CREF4. The gate of the selection transistor QREF4 is connected to the word line WLA. The other electrode of the ferroelectric capacitor CREF4 is integrated with the plate line CPA used as a common electrode.

The gate, source and drain of the write transistor QW4 are connected to the write transistor control line RE, an end of the reset line RST4, and an end of the sub-bit line SBL4, respectively. The gate, source and drain of the read transistor QR4 are connected to the end of the sub-bit line SBL4, the end of the reset line RST4 used as a source line, and an end of the bit line BL4, respectively.

The sixth memory cell block MC5 has a data storage memory cell including a ferroelectric capacitor C51 and a selection transistor Q51, a data storage memory cell including a ferroelectric capacitor C53 and a selection transistor Q53, a reference data storage memory cell including a ferroelectric capacitor CREF5 and a selection transistor QREF5, a write transistor QW5 and a read transistor QR5.

The selection transistor Q51 is serially connected between the sub-bit line SBL5 and one of the electrodes of the ferroelectric capacitor C51. The gate of the selection transistor Q51 is connected to the word line WL1. The other electrode of the ferroelectric capacitor C51 is integrated with the plate line CP1 used as a common electrode. The selection transistor Q53 is serially connected between the sub-bit line SBL5 and one of the electrodes of the ferroelectric capacitor C53. The gate of the selection transistor Q53 is connected to the word line WL3. The other electrode of the ferroelectric capacitor C53 is integrated with the plate line CP3 used as a common electrode. The selection transistor QREF5 is serially connected between the sub-bit line SBL5 and one of the electrodes of the ferroelectric capacitor CREF5. The gate of the selection transistor QREF5 is connected to the word line WLB. The other electrode of the ferroelectric capacitor CREF5 is integrated with the plate line CPB used as a common electrode.

The gate, source and drain of the write transistor QW5 are connected to the write transistor control line RE, an end of the reset line RST5, and an end of the sub-bit line SBL5, respectively. The gate, source and drain of the read transistor QR5 are connected to the end of the sub-bit line SBL5, the end of the reset line RST5 used as a source line, and an end of the bit line BL5, respectively.

The other ends of the bit lines BL0 and BL1 are connected to a sense amplifier SA0, to which data bus lines DL0 and XDL0 are connected. The other ends of the bit lines BL2 and BL3 are connected to a sense amplifier SA1, to which data bus lines DL1 and XDL1 are connected. The other ends of the bit lines BL4 and BL5 are connected to a sense amplifier SA2, to which data bus lines DL2 and XDL2 are connected.

A sense amplifier activation control line SAP is connected to the sense amplifiers SA0, SA1 and SA2. A cross-coupled inverter is used for the sense amplifiers SA0, SA1 and SA2.

The other ends of the sub-bit lines SBL1 and SBL2 are connected to the drain/source of a sub-bit line coupling transistor QS12 serving as a switch for coupling the sub-bit lines. The gate of the sub-bit line coupling transistor QS12 is connected to a sub-bit line coupling control line CSB. Likewise, the other ends of the sub-bit lines SBL3 and SBL4 are connected to the drain/source of a sub-bit line coupling transistor QS34 serving as a switch for coupling the sub-bit lines. The gate of the sub-bit line coupling transistor QS34 is connected to a sub-bit line coupling control line CSA. Therefore, the ends of the sub-bit lines SBL3 and SBL4 are connected to or disconnected from each other with the switching of the sub-bit coupling transistor. The other ends of the sub-bit lines SBL0 and SBL5 are also coupled with respective corresponding sub-bit lines in the same manner.

Figure 10:
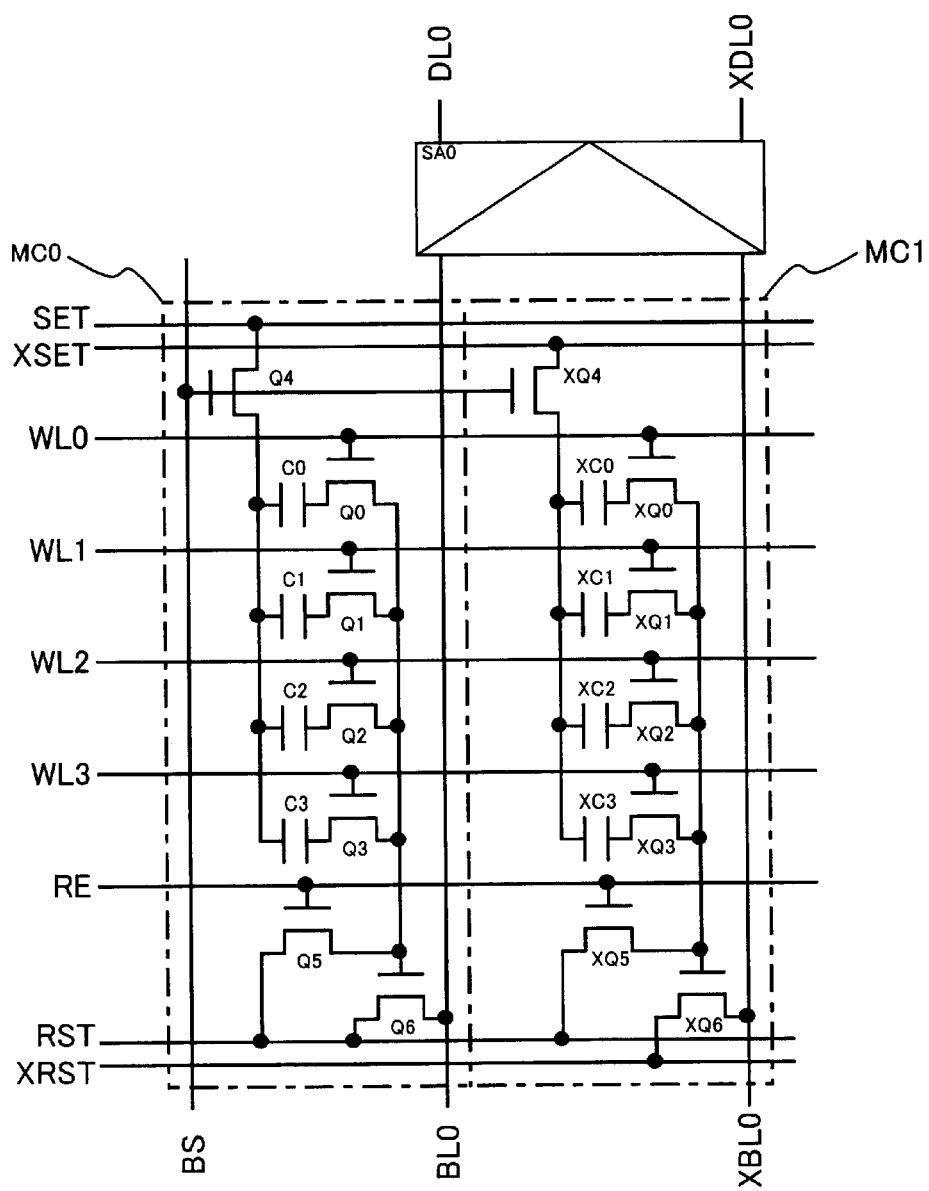
FIG. 10 is a circuit diagram of another conventional semiconductor memory device, on which the present invention is predicated.

A feature of Embodiment 1 is that the plate lines CP0, CP2, CPA and CPB, for example, extend in the word line direction. By adopting this layout, the block selection transistors Q4 and XQ4, required for the conventional semiconductor memory device permitting non-corruption read shown in FIG. 10, are no more required, and this can reduce the area of the memory cell blocks.

Data Write Operation

Hereinafter, the operation of writing data in the semiconductor memory device of Embodiment 1 will be described. In the following description, assume that data is to be written in the ferroelectric capacitor C21 of the third memory cell block MC2, as an example.

During the data write, the potential of the write transistor control line RE is set at a boosted level voltage (VPP) boosted from the power supply voltage VDD, and thus the write transistor QW2 is in the ON state.

Figure 2:
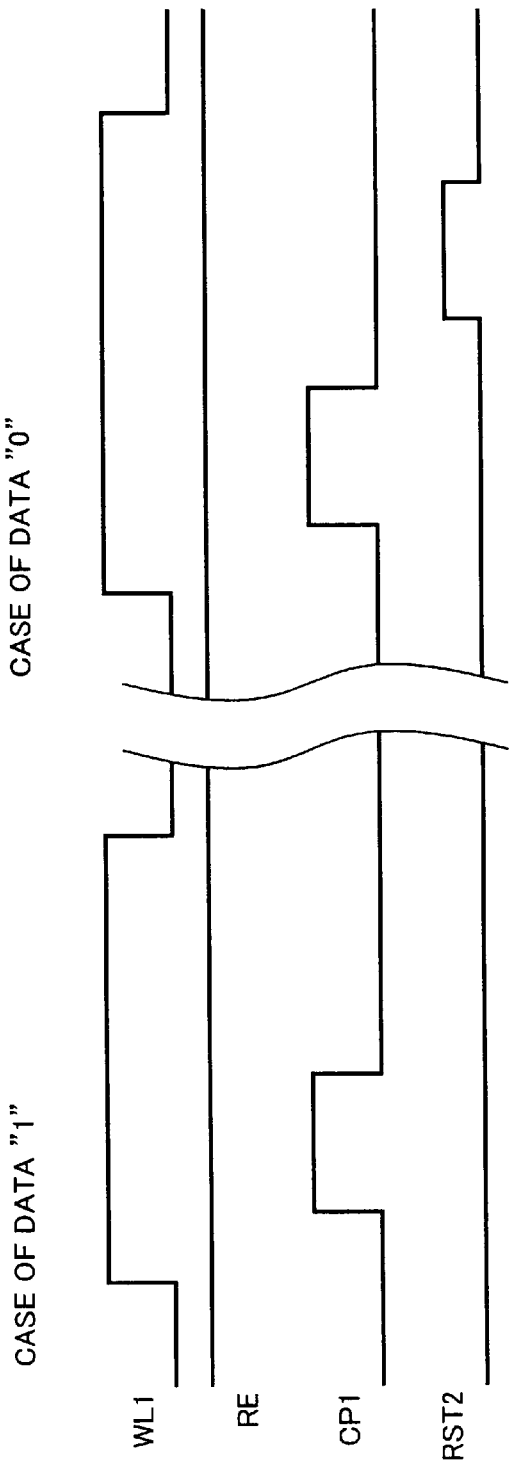
FIG. 2 is a waveform chart of applied voltages during write operation in drive methods for semiconductor memory devices of Embodiments 1 and 2 of the present invention.

First, as shown in the waveform chart of voltages applied to the relevant lines in FIG. 2, a pulse of the boosted level voltage VPP is applied to the selected word line WL1 to turn on the selection transistor Q21, and in this state, the reset line RST2 is set at a low level. When data "1" is to be written, a write pulse of the VDD level is applied to the plate line CP1. By this application, the ferroelectric film of the ferroelectric capacitor C21 has upward polarization. When data "0" is to be written, a write pulse of the VDD level is applied to the plate line CP1, and then a write pulse of a VDD/2 level is applied to the reset line RST2. By this application, the ferroelectric film of the ferroelectric capacitor C21 has downward polarization.

In the write operation, the absolute of the voltage applied between the electrodes of the ferroelectric capacitor C21 is VDD for data "1" and VDD/2 for data "0". Therefore, the ferroelectric capacitor C21 is in an upward saturated polarization state for data "1" and in a downward unsaturated polarization state for data "0".

Figure 3:
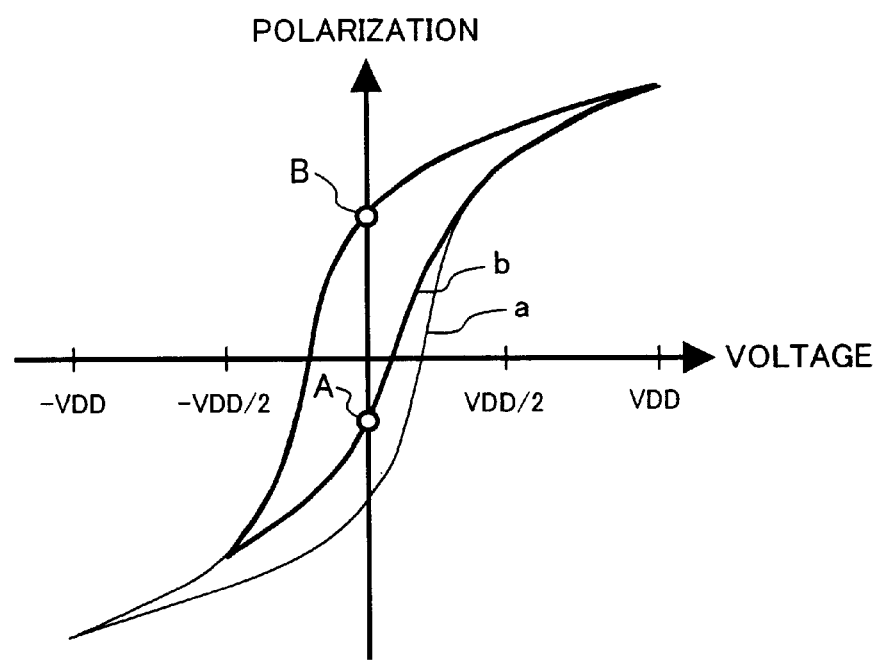
FIG. 3 is a view showing the state of polarization of a ferroelectric film during the write operation in the drive methods for the semiconductor memory devices of Embodiments 1 and 2 of the present invention.

FIG. 3 shows the polarization state of the ferroelectric film during the write operation, in which the potential of the lower electrode integrated with the plate line CP1 is considered positive in the voltage axis (x-axis). Curve a represents the polarization values obtained when the voltage is applied in the range of −VDD to +VDD, which forms a saturated hysteresis loop. Curve b represents the polarization values obtained when the voltage is applied in the range of −VDD/2 to +VDD, which forms a loop saturated on the positive side but unsaturated on the negative side. Among two points A and B at which curve b as the hysteresis loop intersects with the polarization axis, point A represents the polarization value obtained when data "0" is written and point B represents the polarization value obtained when data "1" is written.

In Embodiment 1, the absolute of the voltage applied to the ferroelectric capacitor is made to differ between when data "0" is written and when data "1" is written, because it has been found from an experiment performed by the present inventors that this setting improves the reliability of the semiconductor memory device. This will be demonstrated as follows with reference to FIG. 4.

Figure 4:
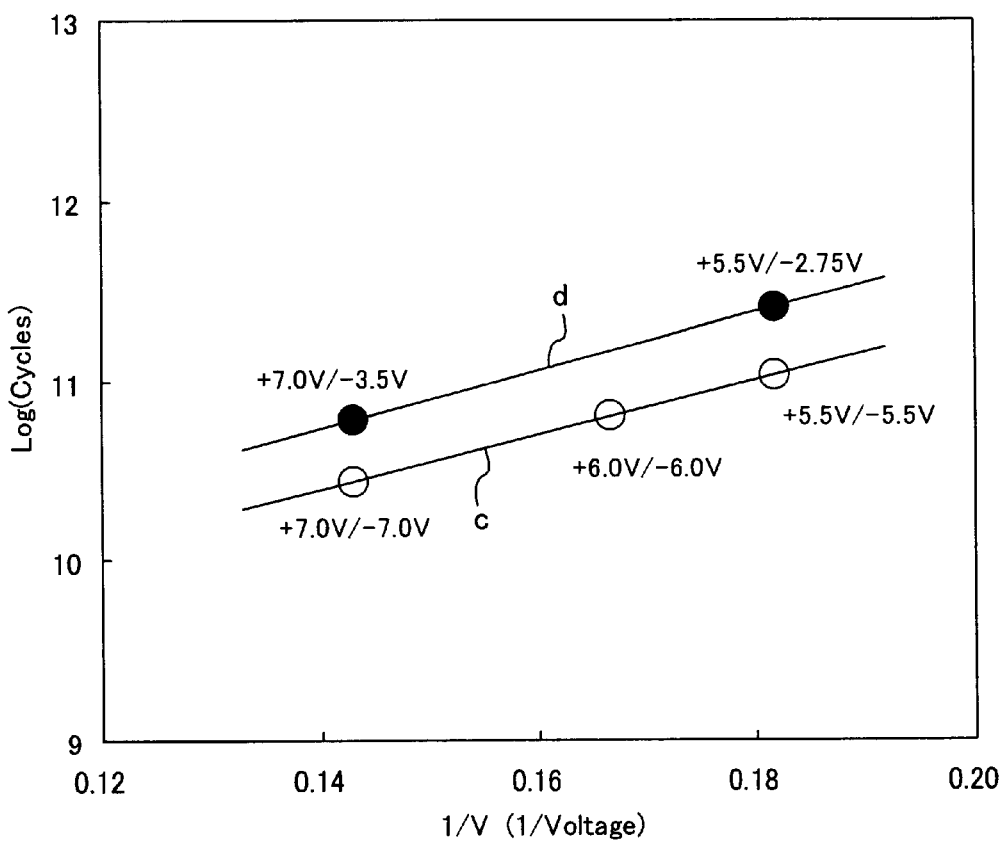
FIG. 4 is a view showing the results of an evaluation test performed for the semiconductor memory device of Embodiment 1 of the present invention.

FIG. 4 is a plot of the number of times of rewrite (y-axis) by which the polarization value is halved due to fatigue degradation when data "1" and data "0" are alternately rewritten in a ferroelectric capacitor, with respect to the reciprocal of the maximum applied voltage (x-axis). In FIG. 4, straight line c represents the case that the absolutes of the positive and negative rewrite voltages were made the same, and straight line d represents the case that the absolute of the negative rewrite voltage was made a half of that of the positive rewrite voltage. From FIG. 4, it is found that the number of times of rewrite allowed increases when the absolute of the negative rewrite voltage is made smaller than that of the positive rewrite voltage.

Figure 5:
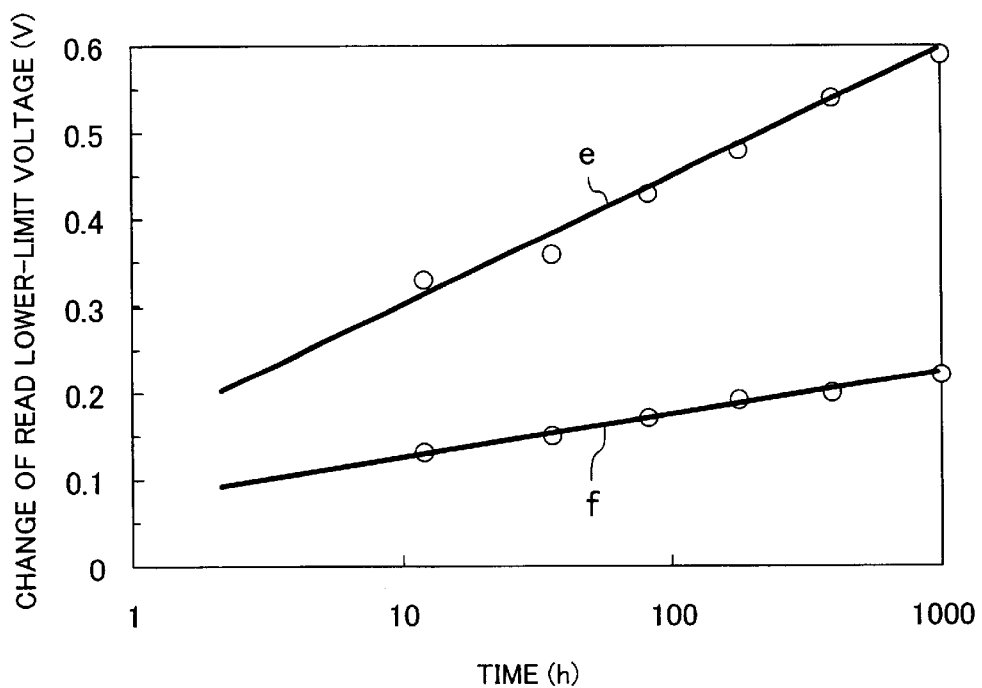
FIG. 5 is a view showing the results of another evaluation test performed for the semiconductor memory device of Embodiment 1 of the present invention.

The present inventors also performed an experiment as follows. Data rewrite operation was performed 10 billion times for a semiconductor memory device having the circuit configuration shown in FIG. 1. The semiconductor memory device was then placed in an environment of 100° C., and under this condition, data read operation to be described later was performed. FIG. 5 shows changes of the lower limit of the read voltage (VRD) with which data can be read (y-axis) with respect to the time for which the device was placed in an environment of 100° C. (x-axis). In FIG. 5, straight line e represents the case that the absolutes of the positive and negative rewrite voltages were the same, and straight line f represents the case that the absolute of the negative rewrite voltage was made a half of that of the positive rewrite voltage.

From FIG. 5, it is found that when the absolute of the negative rewrite voltage is smaller than that of the positive rewrite voltage, the change of the lower limit of the read voltage after the holding of the device in a high-temperature environment is small, that is, stable operation is attained with the read operation range being maintained.

From the experiment results shown in FIGS. 4 and 5, it is found that the reliability of the semiconductor memory device improves by adopting the asymmetric drive method in which the absolute of the voltage applied when data "0" is written is made smaller than the absolute of the voltage applied when data "1" is written.

Data Read Operation

Hereinafter, the operation of reading data from the semiconductor memory device of Embodiment 1 will be described. In the following description, assume that data stored in the ferroelectric capacitor C21 of the third memory cell block MC2 is to be read, as an example.

First, data "0", for example, is written in the ferroelectric capacitors CREF0, CREF2 and CREF4 of the reference data storage memory cells of the first, third and fifth memory cell blocks MC0, MC2 and MC4, and data "1", for example, is written in the ferroelectric capacitors CREF1, CREF3 and CREF5 of the reference data storage memory cells of the second, fourth and sixth memory cell blocks MC1, MC3 and MC5, in the manner described above with reference to the data write operation.

Figure 6:
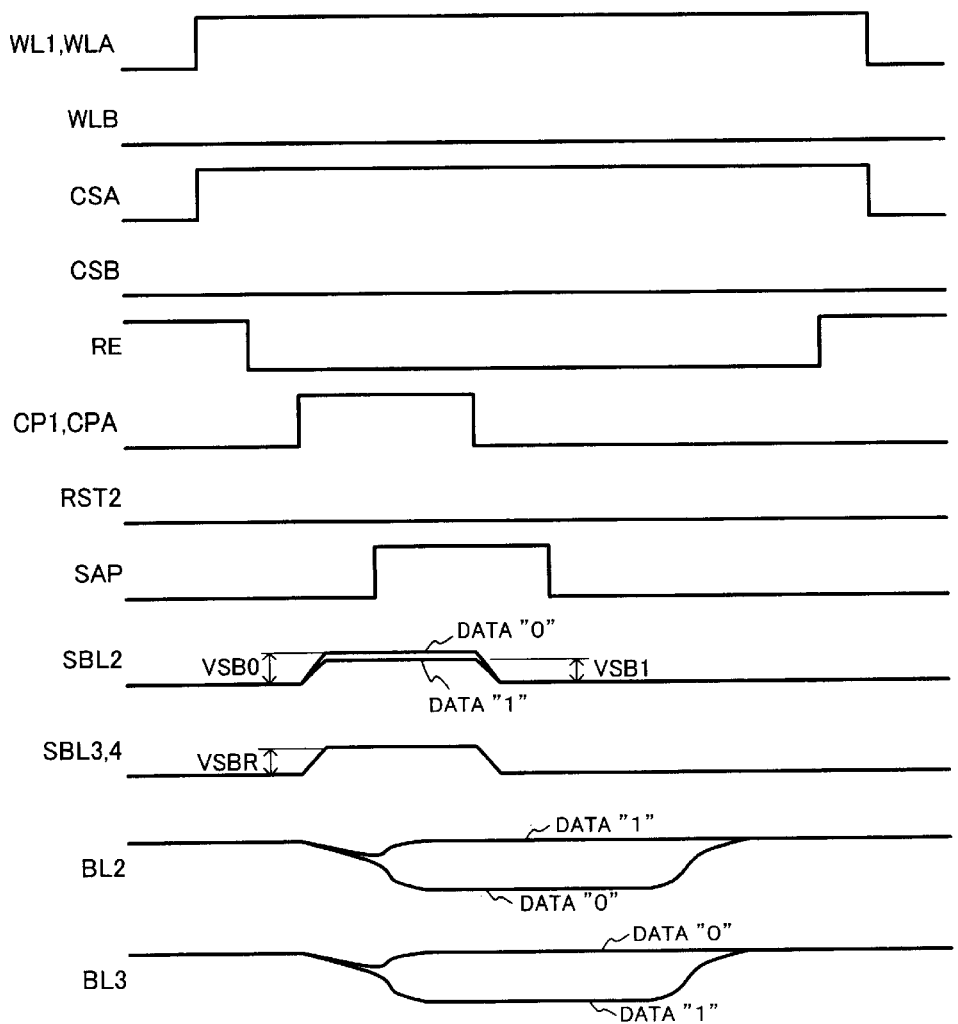
FIG. 6 is a waveform chart of applied voltages during read operation in the drive methods for the semiconductor memory devices of Embodiments 1 and 2 of the present invention.

Thereafter, as shown in the waveform chart of voltages applied to the relevant lines in FIG. 6, a pulse of the boosted level voltage VPP is applied to the selected word line WL1 to turn on the selection transistor Q21. Also, a low signal is applied to the sub-bit line coupling control signal CSB, a high signal is applied to the sub-bit line coupling control signal CSA, a high signal is applied to the word line WLA, and a low signal is applied to the word line WLB.

By the operation described above, the read transistor QR2 is connected to the ferroelectric capacitor C21 storing data. Also, the read transistors QR3 and QR4 are connected to the ferroelectric capacitors CREF3 and CREF4 storing reference data. In other words, among the memory cells storing reference data, the ferroelectric capacitor CREF3 storing data "1" and the ferroelectric capacitor CREF4 storing data "0" are connected with the two read transistors QR3 and QR4 serving as a load.

In the state described above, with the write transistor control line RE being in the high level, the sub-bit line, one electrode of the ferroelectric capacitor and the gate of the read transistor are connected to the reset line. These nodes are therefore reset to the potential of the reset line. After the reset operation, the write transistor control line RE is turned to a low level, to turn off the write transistor.

As described above, in Embodiment 1, the selection transistor Q21 of the data read memory cell is turned on, to connect one of the paired electrodes of the ferroelectric capacitor C21 of the data read memory cell to the sub-bit line SBL2. In addition, the write transistor QW2 is turned on, to connect an end of the sub-bit line SBL2 to the reset line RST2. In this state, a reset voltage is applied to the reset line RST2, and then the write transistor QW2 is turned off, to disconnect the end of the sub-bit line SBL2 from the reset line RST2. In this state, a read voltage is applied to the other electrode of the ferroelectric capacitor C21 of the data read memory cell, to read the data. That is to say, since a read voltage is applied after the potential of the sub-bit line SBL2 to which the data read memory cell is connected has been reset, stable read operation is possible.

Thereafter, a pulse of the read voltage VRD is applied to the cell plate line CP1 and CPA. By this application of the read voltage VRD to the cell plate line CP1, the potential of the sub-bit line SBL2 becomes a value determined by capacitance splitting between the capacitance value of the ferroelectric capacitor C21 and the line capacitance value of the sub-bit line SBL2.

It is defined that the line capacitance (CSB) of the sub-bit line includes the gate capacitance of the read transistor, the source capacitance of the connected selection transistor, the inter-connect capacitance and the like.

Polarization corresponding to data "0" or data "$\mu$1" has been written in the ferroelectric capacitor C21. When the capacitance value of the ferroelectric capacitor C21 corresponding to the polarization value for data "1" is CF1 and the capacitance value thereof corresponding to the polarization value for data "0" is CF0, the potentials VSB1 and VSB0 of the sub-bit line SBL2 obtained when data "1" and data "0", respectively, have been written are represented by expressions (1) and (2) below.

$$VSB1 = CF1 \times VRD/(CF1 + CSB) \quad (1)$$

$$VSB0 = CF0 \times VRD/(CF0 + CSB) \quad (2)$$

Since CF1<CF0, VSB1<VSB0.

Likewise, by the pulse application to the cell plate line CPA, the potential of the sub-bit lines SBL3 and SBL4 is a value determined by capacitance splitting between the sum of the capacitance values of the ferroelectric capacitors CREF3 and CREF4 and the sum of the line capacitance values of the sub-bit lines SBL3 and SBL4.

The capacitance value of the ferroelectric capacitor CREF3 storing reference data "1" is CF1, and the capacitance value of the ferroelectric capacitor CREF4 storing reference data "0" is CFO. Therefore, the potential VSBR of the sub-bit lines SBL3 and SBL4 is represented by expression (3) below.

$$VSBR = (CF1 + CF0) \times VRD/(CF1 + CF0 + 2 \cdot CSB) \quad (3)$$

Since CF1<CF0, VSB1<VSBR<VSB0.

In response to the generation of the potentials of the sub-bit line SBL2 and the sub-bit lines SBL3 and SBL4, the read transistor QR2 and the read transistors QR3 and QR4 change from the OFF state to a conduction state of a level according to the potential of the sub-bit line. If the bit lines have been precharged to a high level, the potentials VBL2 and VBL3 of the bit lines BL2 and BL3 gradually decrease via the read transistors QR2 and QR3 in the conduction state.

When the data stored in the ferroelectric capacitor C21 is "1", VSB1<VSBR. In this case, the conductance of the read transistor QR2 is smaller than that of the read transistor QR3, and thus VBL2 >VBL3. When the data stored in the ferroelectric capacitor C21 is "0", VSBR<VSB0. In this case, the conductance of the read transistor QR2 is greater than that of the read transistor QR3, and thus VBL2<VBL3. At this stage, the potential difference between VBL2 and VBL3 is minute.

To amplify the minute potential difference, a pulse is applied to the sense amplifier activation control line SAP. With the pulse from the sense amplifier activation control line SAP, the sense amplifier SA1 amplifies the minute potential difference between the bit line BL2 and the bit line BL3. More specifically, when the data stored in the ferroelectric capacitor C21 is "1", the sense amplifier SA1 raises the potential VBL2 while lowering the potential VBL3. When the data stored in the ferroelectric capacitor C21 is "0", the sense amplifier SA1 lowers the potential VBL2 while raising the potential VBL3.

Once the sense amplifier SA1 completes the amplification of the bit line potentials, the cell plate lines CPl and CPA are turned off. This cuts off a through current flowing through the sense amplifier→bit line→read transistor→reset line, and thus saves power consumption.

Thereafter, the logic levels of the bit lines BL2 and BL3 are output to the data buses DL1 and XDL1. The read data from the ferroelectric capacitor C21 is determined as "1" when the potential of the data bus DL1 is in a high level and the potential of the data bus XDL1 is in a low level, and "0" when these potentials are in the opposite logic levels.

Subsequently, the sense amplifier activation control line SAP is turned off, the bit lines are charged to a high level, and the write transistor control line RE is turned to a high level, to thereby connect the sub-bit line, the ferroelectric capacitor and the gate of the read transistor to the reset line. In this way, these nodes are reset to the reset potential.

By resetting as described above, the potential of the sub-bit line SBL2 to which the data read memory cell is connected can be reset after the data read from the data read memory cell. This prevents an occurrence that data may be destroyed due to an unwanted voltage remaining in the storage node, and thus stable data retention is ensured.

Thereafter, the word lines WL1 and WLA and the sub-bit line coupling control line CSA are turned off, to thereby complete the read operation.

In the read operation described above, by appropriately setting the read voltage VRD to be applied to the cell plate line, the polarization can be suppressed from changing between before and after the read operation, and thus non-corruption read operation is attained.

Hereinafter, the set range of the read voltage VRD determined based on the results of an experiment performed using a prototype semiconductor memory device fabricated by the present inventors will be described.

The details of the prototype semiconductor memory device used for the experiment are as follows. The area of each ferroelectric capacitor is 9 $\mu m^2$, and the thickness thereof is 200 nm. The ferroelectric film is made of strontium bismuth tantalite. For the selection transistors and the write transistors, the gate width is 2 $\mu m$, the gate length is 0.6 $\mu m$, and the thickness of the gate insulation film is 13.5 nm. For the read transistors, the gate width is 10.35 $\mu m$, the gate length is 1.6 $\mu m$, and the thickness of the gate insulation film is 13.5 nm. The number of memory cells connected to each sub-bit line is 16, which is larger than that in the exemplary circuit configuration shown in FIG. 1.

For the prototype semiconductor memory device, the range of the read voltage VRD allowing non-corruption data read was from 2.2 V to 3.7 V at room temperature. If the read voltage VRD is below this range, the sense amplifier fails to amplify the minute voltage difference of the bit lines. If the read voltage VRD exceeds this range, the polarization changes between before and after the read operation. Therefore, the non-corruption read operation was not allowed with a read voltage VRD falling outside the above range.

Using the prototype semiconductor memory device, the read operation was performed a plurality of times continuously with the read voltage VRD set in the range of 2.2 V to 3.7 V, to examine a change of the range of the read voltage VRD allowing non-corruption data read for 64 Kbits.

Figure 7:
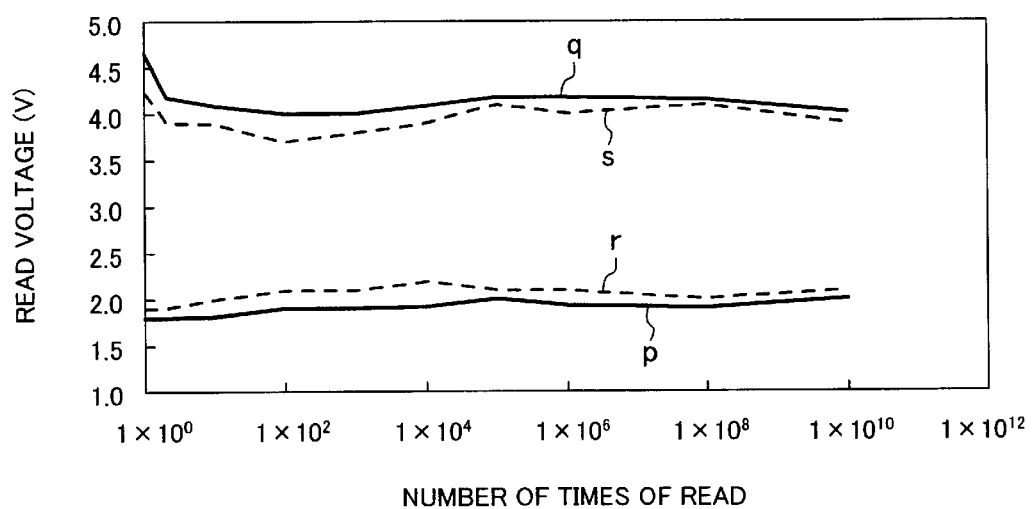
FIG. 7 is a view showing the results of yet another evaluation test performed for the semiconductor memory device of Embodiment 1 of the present invention.

FIG. 7 shows the results of the above experiment, in which p and q respectively represent the averages of the lower limit and the upper limit of the read voltage VRD allowing data read, and r and s represent the worst values of the lower limit and the upper limit of the read voltage VRD allowing data read.

The conventional semiconductor memory device shown in FIG. 10 had the problem that the range of the operating voltage was narrowed after 10 billion times of read operation as described above. According to the prototype semiconductor memory device of the present invention, however, it was confirmed that the operation range was stable after 10 billion times of read operation.

In Embodiment 1, described was the drive method in which the direction of the polarization will not be changed between before and after the read operation. Alternatively, a greater read voltage may be applied to the cell plate line during the read operation, and the direction of the polarization changed by this application may be changed back to the original by data rewrite. In this case, although the number of times of read is limited to 10 billion times, the effect of reducing the cell area by adopting the 1 T1C structure is attained.

Embodiment 2

A semiconductor memory device of Embodiment 2 of the present invention will be described with reference to FIG. 8.

In Embodiment 2, only part of the configuration different from that of Embodiment 1 described with reference to FIG. 1 will be described. The same components as those in Embodiment 1 are denoted by the same reference numerals, and the description thereof is omitted here.

Figure 8:
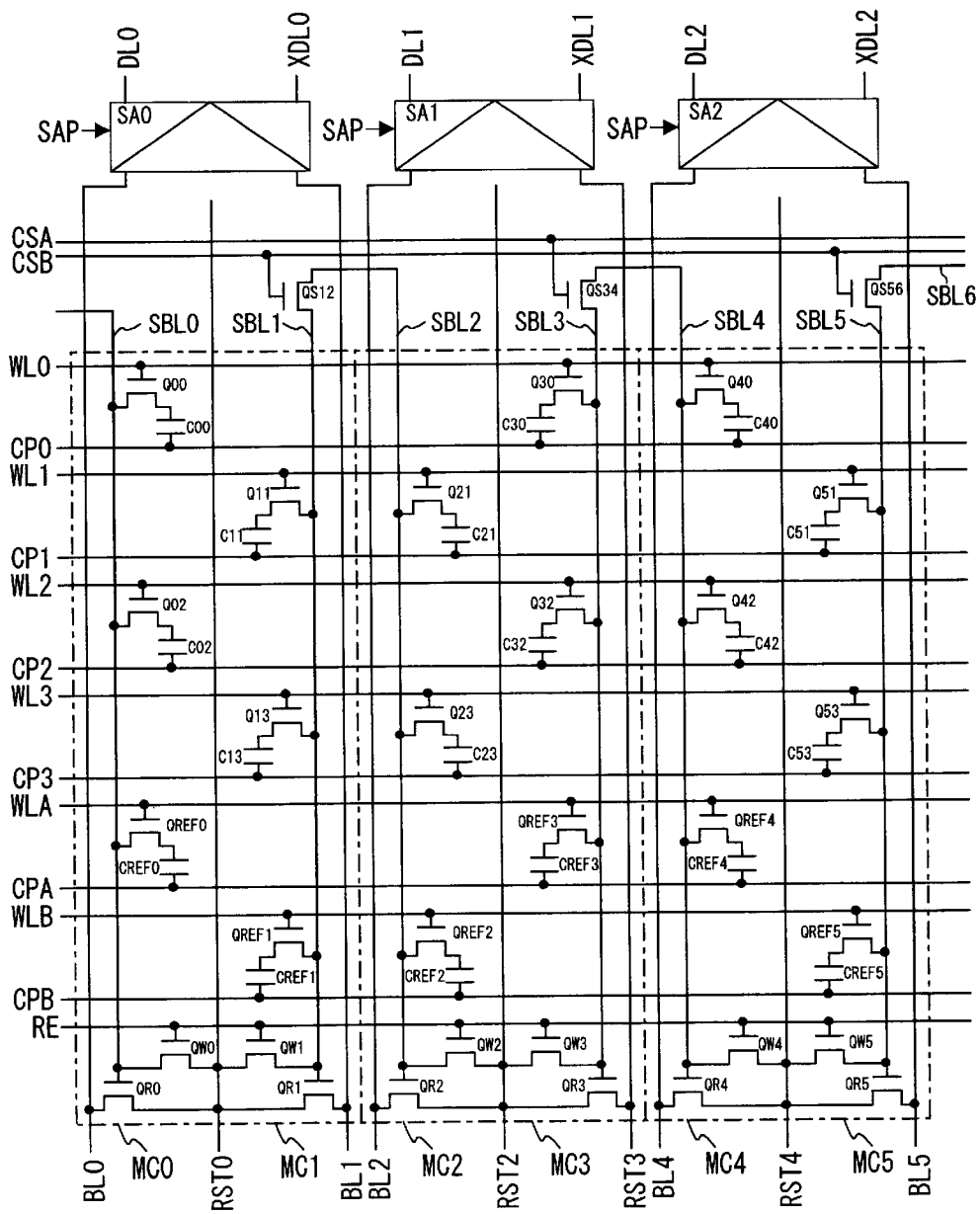
FIG. 8 is a circuit diagram of the semiconductor memory device of Embodiment 2 of the present invention.
Figure 9:
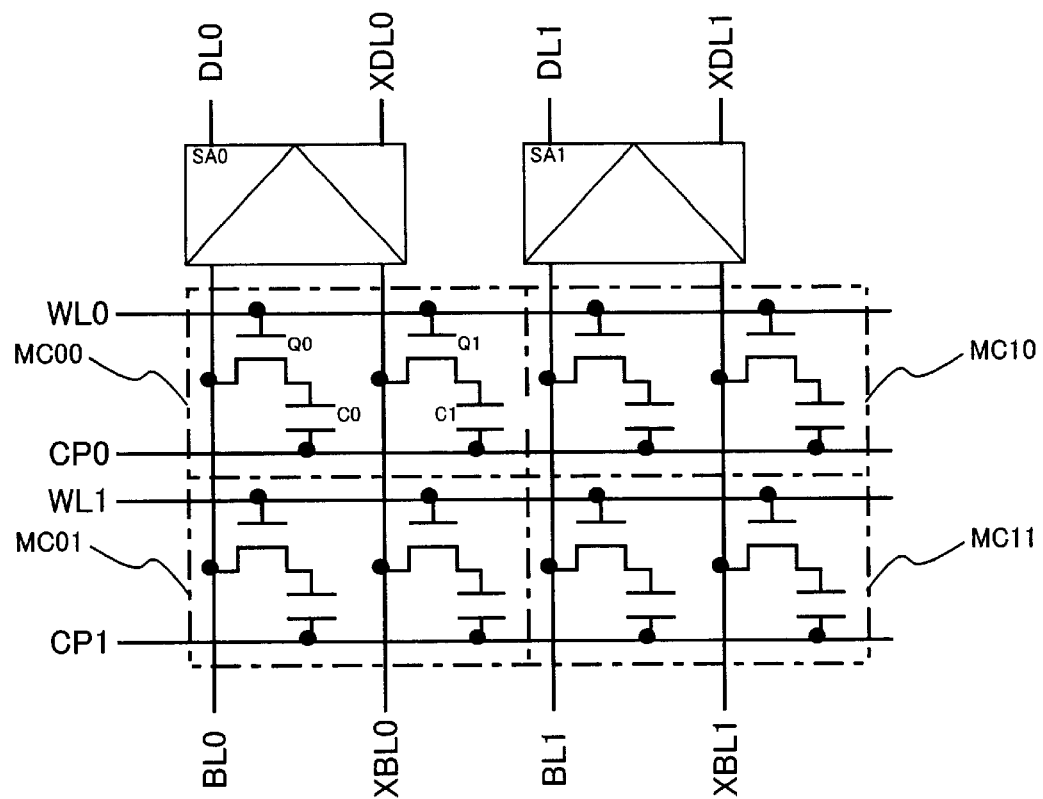
FIG. 9 is a circuit diagram of a conventional semiconductor memory device.

Referring to FIG. 8, in Embodiment 2, every two adjacent memory cell blocks share one reset line. To state specifically, a common reset line RST0 is placed between the first memory cell block MC0 and the second memory cell block MC1, a common reset line RST2 is placed between the third memory cell block MC2 and the fourth memory cell block MC3, and a common reset line RST4 is placed between the fifth memory cell block MC4 and the sixth memory cell block MC5.

The waveforms of the voltages applied to the relevant lines during the write operation are the same as those shown in FIG. 2, and the waveforms of the voltages applied to the relevant lines during the read operation are the same as those shown in FIG. 6.

In Embodiment 2, because of the sharing of the reset line by two adjacent memory cells, the area of the memory cell blocks can be further decreased.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A semiconductor memory device comprising at least three memory cell blocks arranged in a word line direction, each of the at least three memory cell blocks comprising a plurality of memory cells arranged in a bit line direction, each of the plurality of memory cells comprising a ferroelectric capacitor for storing data by displacement of polarization of a ferroelectric film and a selection transistor connected to one of paired electrodes of the ferroelectric capacitor, wherein each of the at least three memory cell blocks comprises:

a bit line, a sub-bit line and a source line extending in the bit line direction; and a read transistor having a gate connected to one end of the sub-bit line, a source connected to the source line, and a drain connected to one end of the bit line, the read transistor reads data by detecting the displacement of the polarization of the ferroelectric film of the ferroelectric capacitor of a data read memory cell from which data is read among the plurality of memory cells, and the sub-bit lines of two memory cell blocks among the at least three memory cell blocks are connected to each other via a sub-bit line coupling switch.

2. The device of claim 1, wherein each of the at least three memory cell blocks comprises a reset line extending in the bit line direction, and the sub-bit line is connected to the reset line via a reset switch.

3. The device of claim 2, wherein the reset line and the source line are the same line.

4. The device of claim 2, wherein two memory cell blocks adjacent in the word line direction among the at least three memory cell blocks share the reset line.

5. The device of claim 1, wherein the other electrodes of the paired electrodes of the ferroelectric capacitors of memory cells arranged in the word line direction among the plurality of memory cells belonging to the at least three memory cell blocks constitute a common electrode extending in the word line direction.

6. A drive method for the semiconductor memory device of claim 1, comprising the steps of:

writing reference data "1" in one of two memory cells adjacent to each other in the word line direction, while writing reference data "0" in the other memory cell of the two memory cells, the two memory cells belonging to two memory cell blocks of which the sub-bit lines are connected to each other via the sub-bit line coupling switch among the at least three memory cell blocks;

determining a reference voltage from a voltage between the paired electrodes of the ferroelectric capacitor of the memory cell in which the reference data "1" has been written and a voltage between the paired electrodes of the ferroelectric capacitor of the memory cell in which the reference data "0" has been written; and reading the data stored in the ferroelectric capacitor of the data read memory cell among the plurality of memory cells belonging to a memory cell block different from the two memory cell blocks among the at least three memory cell blocks by comparing a voltage between the paired electrodes of the ferroelectric capacitor of the data read memory cell with the reference voltage.

7. The drive method of claim 6, wherein each of the at least three memory cell blocks comprises a reset line extending in the bit line direction, and the sub-bit line is connected to the reset line via a reset switch, the step of reading the data comprises the steps of:

connecting one of the paired electrodes of the ferroelectric capacitor of the data read memory cell to the sub-bit line by turning on the selection transistor of the data read memory cell, connecting the sub-bit line to the reset line by turning on the reset switch, and in this state, applying a reset voltage to the reset line;

disconnecting the sub-bit line from the reset line by turning off the reset switch; and reading the data by applying a read voltage to the other electrode of the ferroelectric capacitor of the data read memory cell in the state that the sub-bit line is disconnected from the reset line.

8. The drive method of claim 6, wherein each of the at least three memory cell blocks comprises a reset line extending in the bit line direction, and the sub-bit line is connected to the reset line via a reset switch, the drive method further comprises, after the step of reading the data, the steps of:

connecting one of the paired electrodes of the ferroelectric capacitor of the data read memory cell to the sub-bit line by turning on the selection transistor of the data read memory cell, connecting the sub-bit line to the reset line by turning on the reset switch, and in this state, applying a reset voltage to the reset line; and disconnecting the sub-bit line from the reset line by turning off the reset switch.

9. The drive method of claim 6, wherein the step of reading the data comprises the steps of:

reading the data by applying a read voltage to the other electrode of the ferroelectric capacitor of the data read memory cell; and removing the read voltage applied to the other electrode of the ferroelectric capacitor of the data read memory cell, wherein the read voltage is set at a level of value with which the displacement of the polarization of the ferroelectric film of the ferroelectric capacitor of the data read memory cell resumes the original displacement before the data read when the read voltage is removed.

10. The drive method of claim 9, wherein the read voltage is set at a level of value greater than a detection limit of a comparator comparing the voltage between the paired electrodes of the ferroelectric capacitor of the data read memory cell with the reference voltage and smaller than a resistive electric field between the paired electrodes of the ferroelectric capacitor of the data read memory cell.

11. The drive method of claim 6, wherein each of the at least three memory cell blocks comprises a reset line extending in the bit line direction, and the sub-bit line is connected to the reset line via a reset switch, the drive method further comprises the step of:
    writing data in the ferroelectric capacitor of a data write memory cell among the plurality of memory cells belonging to the at least three memory cell blocks,
the step of writing data comprises the step of:
    connecting one of the paired electrodes of the ferroelectric capacitor of the data write memory cell to the sub-bit line by turning on the selection transistor of the data write memory cell, connecting the sub-bit line to the reset line by turning on the reset switch, and in this state, applying a write voltage corresponding to binary data between the other electrode of the ferroelectric capacitor of the data write memory cell and the reset line.

12. The drive method of claim 11, wherein the absolute of the write voltage when the binary data is data "0" is different from the absolute of the write voltage when the binary data is data "1".

* * * * *